(12) United States Patent
Lee

(10) Patent No.: US 8,593,892 B2
(45) Date of Patent: Nov. 26, 2013

(54) SEMICONDUCTOR DEVICE AND SYSTEM

(75) Inventor: Dong Uk Lee, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 502 days.

(21) Appl. No.: 13/035,103

(22) Filed: Feb. 25, 2011

(65) Prior Publication Data
US 2011/0242909 A1 Oct. 6, 2011

(30) Foreign Application Priority Data
Apr. 1, 2010 (KR) .................. 10-2010-0029937

(51) Int. Cl.
*G11C 7/00* (2006.01)
(52) U.S. Cl.
USPC .......................... 365/193; 365/233.1
(58) Field of Classification Search
None
See application file for complete search history.

(56) References Cited

U.S. PATENT DOCUMENTS

| | | | |
|---|---|---|---|
| 6,178,518 B1 | 1/2001 | Toda | |
| 6,292,410 B1 | 9/2001 | Yi et al. | |
| 6,629,222 B1 | 9/2003 | Jeddeloh | |
| 6,760,856 B1 | 7/2004 | Borkenhagen et al. | |
| 7,173,866 B2* | 2/2007 | Na et al. | 365/193 |
| 7,362,634 B2 | 4/2008 | Kwak | |
| 7,593,273 B2 | 9/2009 | Chu et al. | |
| 7,626,873 B2* | 12/2009 | Ku | 365/193 |
| 7,710,817 B2* | 5/2010 | Kim et al. | 365/233.11 |
| 7,715,252 B2 | 5/2010 | Lee | |
| 8,031,553 B2* | 10/2011 | Byun | 365/233.1 |

FOREIGN PATENT DOCUMENTS

KR 1020050057782 A 6/2005

* cited by examiner

*Primary Examiner* — Alexander Sofocleous
(74) *Attorney, Agent, or Firm* — William Park & Associates Patent Ltd.

(57) ABSTRACT

A system includes a data transmitting device and a data receiving device. The data transmitting device includes a data strobe signal generation unit configured to generate first and second data strobe signals in response to an output enable signal, and a data output unit configured to transmit data in synchronization with the first data strobe signal. The data receiving device is configured to receive the data in synchronization with the second data strobe signal.

26 Claims, 16 Drawing Sheets

SEMICONDUCTOR DEVICE AND SYSTEM

CROSS-REFERENCES TO RELATED APPLICATIONS

The present application claims priority under 35 U.S.C 119(a) to Korean application number 10-2010-0029937, filed on Apr. 1, 2010, in the Korean intellectual property Office, which is incorporated herein by reference in its entirety.

BACKGROUND

Exemplary embodiments of the present invention generally relate to a semiconductor device and system, and more specifically to a system for synchronizing signals in a semiconductor device.

Semiconductor devices are developed for higher degree of integration and speed. For example, with development of synchronous DRAMs synchronized to a clock, much progress has been made for high-speed operations in the semiconductor devices. Since a synchronous DRAM is generally synchronized to one cycle of an external clock for data input/output, this has presented some limitations to increasing the bandwidth (i.e., the quantity of data inputted/outputted per unit time from a synchronous DRAM) between a synchronous DRAM and a memory controller. Dual data rate (DDR) DRAMs have been developed to further increase the data transfer rate by inputting/outputting the data in synchronization with both the rising and falling edges of a clock.

A DDR DRAM transmits/receives data to/from a memory controller by using a data strobe signal in order to minimize data loss. When a DDR DRAM is transferring data to the memory controller, the DDR DRAM outputs the data in synchronization with a data strobe signal and also outputs the data strobe signal. Then the memory controller receives the data in synchronization with the data strobe signal outputted from the DDR DRAM.

However, since various other devices besides the DDR DRAM and the memory controller are also integrated into the same board in which the DDR DRAM and the memory controller are integrated, the transfer paths of the data strobe signal and the data between the DDR DRAM and the memory controller are not likely to be the same. Because there are differences in the transfer paths, the transfer timings of the data strobe signal and the data are also different from each other. As shown in FIG. 1, for example, the DDR DRAM would output the data strobe signal DQS and the data DQ1, DQ2, DQ3, DQ4 synchronized to the data strobe signal DQS at time t0. However, as shown in FIG. 2, the memory controller cannot synchronize the data DQ1, DQ2, DQ3, DQ4 with the data strobe signal DQS, because the memory controller receives the data strobe signal at the time t1 and the data DQ1, DQ2, DQ3, DQ4 beginning at the time t2.

SUMMARY

An embodiment of the present invention relates to a system for synchronizing signals in a semiconductor device, in which a receiving device stably receives data in synchronization with a data strobe signal even though a difference occurs in transfer paths of the data and the data strobe signal.

In one embodiment, a semiconductor device includes: a first data strobe signal generation unit configured to generate a first data strobe signal which is derived from a clock and an output enable signal, and whose enable timing is delayed in response to data transmission control signals; and a second data strobe signal generation unit configured to generate a second data strobe signal in response to the clock and a plurality of output enable shift signals generated by shifting the output enable signal.

In another embodiment, a semiconductor device includes: a first data strobe signal generation unit configured to generate a first data strobe signal in response to a clock and an output enable signal; and a second data strobe signal generation unit configured to generate a second data strobe signal which is derived from the clock and a plurality of output enable shift signals generated by shifting the output enable signal and whose enable timing is delayed in response to data reception control signals.

In another embodiment, a semiconductor device includes: a digital delay locked loop (DLL) circuit configured to generate a DLL clock by delaying a clock by a set delay interval which is decreased in response to DLL delay setting signals; a first data strobe signal generation unit configured to generate a first data strobe signal which is derived from the DLL clock and an output enable signal and whose enable timing is delayed in response to data transmission control signals; and a second data strobe signal generation unit configured to generate a second data strobe signal which is derived from the DLL clock and a plurality of output enable shift signals generated by shifting the output enable signal and whose enable timing is delayed in response to data reception control signals.

In another embodiment, a system includes: a data transmitting device including a data strobe signal generation unit configured to generate first and second data strobe signals in response to an output enable signal, and a data output unit configured to transmit data in synchronization with the first data strobe signal; and a data receiving device configured to receive the data in synchronization with the second data strobe signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
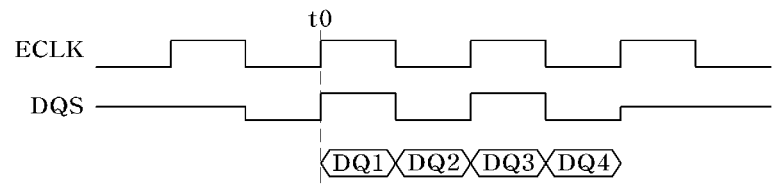
FIG. 1 is a timing diagram showing the relationship of data and a data strobe signal outputted from a conventional semiconductor device operating as a transmitting device.
Figure 2:
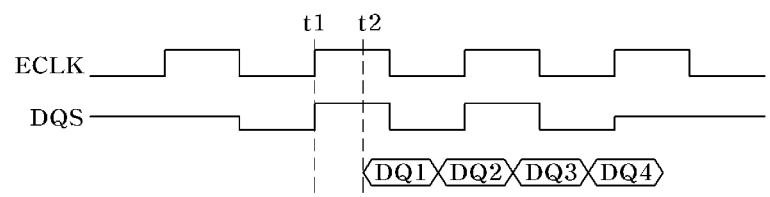
FIG. 2 is a timing diagram showing mismatching of data and a data strobe signal received by a conventional memory controller operating as a receiving device.
Figure 3:
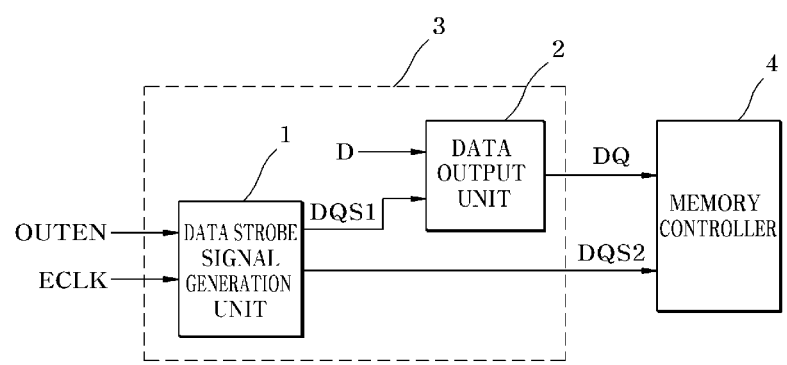
FIG. 3 is a block diagram of a system according to an embodiment of the present invention.

FIG. 3 is a block diagram of a system according to an embodiment of the present invention.

As illustrated in FIG. 3, the system includes, for example, a DDR DRAM 3 and a memory controller 4, which serve as a transmitting device and a receiving device, respectively.

The DDR DRAM 3 includes a data strobe signal generation unit 1 and a data output unit 2. The data strobe signal generation unit 1 is configured to generate first and second data strobe signals DQS1, DQS2 in response to an output enable signal OUTEN. The data output unit 2 is configured to transmit data DQ in synchronization with the first data strobe signal DQS1.

Figure 4:
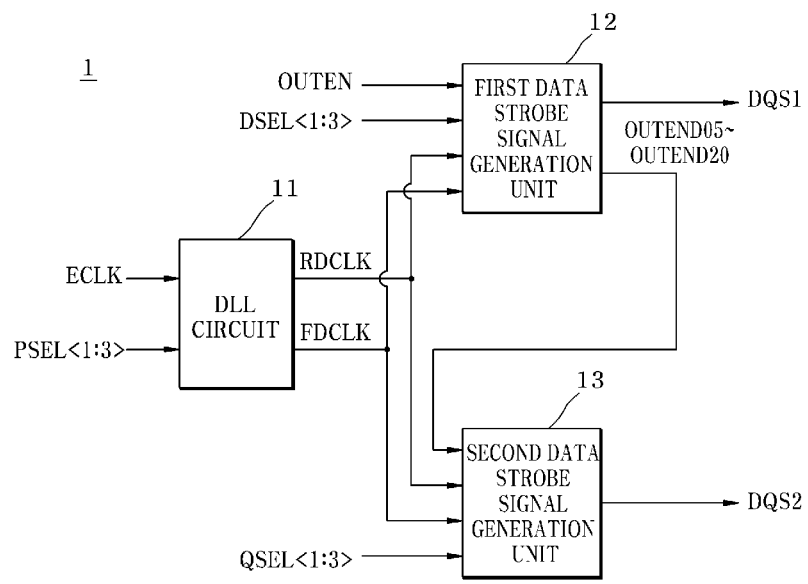
FIG. 4 is a block diagram of a data strobe signal generation unit illustrated in FIG. 3.

As illustrated in FIG. 4, the data strobe signal generation unit 1 includes a digital delay locked loop (DLL) circuit 11, a first data strobe signal generation unit 12, and a second data strobe signal generation unit 13.

Figure 5:
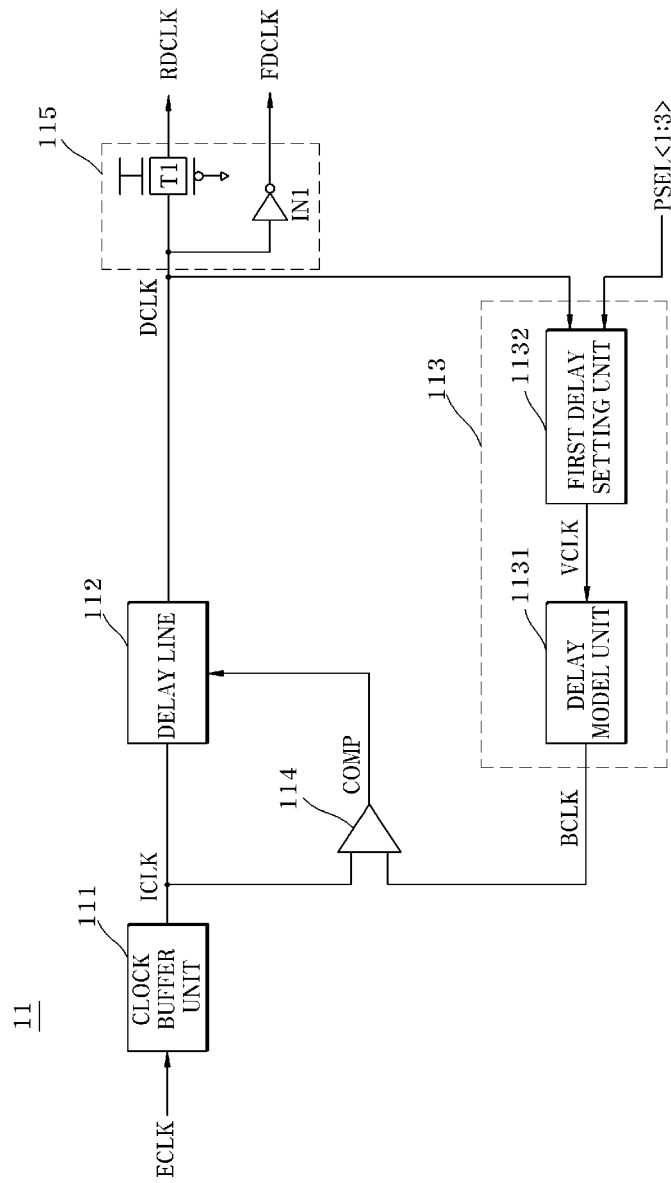
FIG. 5 is a block diagram of a DLL circuit illustrated in FIG. 4.

Referring to FIG. 5, the DLL circuit 11 includes a clock buffer unit 111, a delay line 112, a first delay unit 113, a phase comparison unit 114, and a phase division unit 115.

The clock buffer unit 111 is configured to buffer a clock ECLK and output the buffered clock as an internal clock ICLK.

The delay line 112 is configured to delay the internal clock ICLK according to a plurality of comparison signal COMP and output the delayed internal clock as a DLL clock DCLK.

The first delay unit 113 is configured to delay the DLL clock DCLK in response to a DLL delay setting signal and output the delayed DLL clock as a phase comparison DLL clock BCLK. More specifically, the first delay unit 113 includes a first delay setting unit 1132 and a delay model unit 1131. The first delay setting unit 1132 is configured to output a delay DLL clock VCLK by delaying the DLL clock DCLK according to first, second, and third DLL delay setting signals PSEL<1:3>. The delay model unit 1131 is configured to delay the delay DLL clock VCLK by a fixed delay interval and output a phase comparison DLL clock BCLK.

Figure 6:
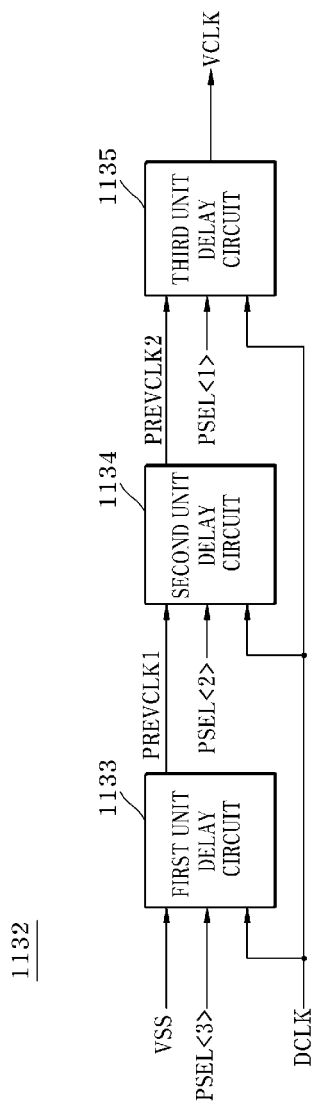
FIG. 6 is a block diagram of a first delay setting unit illustrated in FIG. 5.

Referring to FIG. 6, the first delay setting unit 1132 includes first, second, and third unit delay circuits 1133, 1134, 1135. The first unit delay circuit 1133 is configured to generate a first pre delay DLL clock PREVCLK1 based on the DLL clock DCLK and a ground voltage VSS, which is a pull-down voltage, in response to the third DLL delay control signal PSEL<3>. The second unit delay circuit 1134 is configured to generate a second pre delay DLL clock PREVCLK2 based on the DLL clock DCLK and the first pre delay DLL clock PREVCLK1 in response to the second DLL delay control signal PSEL<2>. The third unit delay circuit 1135 is configured to generate the delay DLL clock VCLK based on the DLL clock DCLK and the second pre delay DLL clock PREVCK2 in response to the first DLL delay control signal PSEL<1>.

Figure 7:
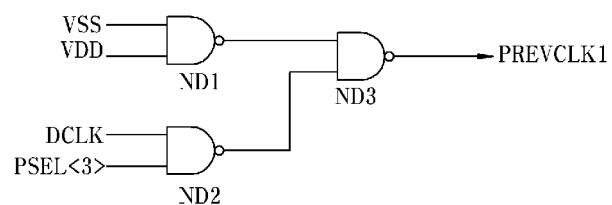
FIG. 7 is a circuit diagram of a first unit delay circuit illustrated in FIG. 6.

More specifically, as shown in FIG. 7, the first unit delay circuit 1133 includes first to third NAND gates ND1, ND2, ND3. The first NAND gate ND1 is configured to perform a NAND operation on the ground voltage VSS and a power supply voltage VDD, which is a pull-up voltage. The second NAND gate ND2 is configured to perform a NAND operation on the DLL clock DCLK and the third DLL delay control signal PSEL<3>. The third NAND gate ND3 is configured to perform a NAND operation on the outputs of the first and second NAND gates ND1, ND2 and output the first pre delay DLL clock PREVCLK1.

In an embodiment of the present invention, the second and third unit delay circuits 1134, 1135 have circuit configurations identical to the first unit delay circuit 1133, except that the second and third unit delay circuits 1134, 1135 receive the first and second pre delay DLL clocks PREVCLK1, PREVCLK2, respectively. Additionally, instead of the ground voltage VSS, the second and third unit delay circuits 1134, 1135 receive the second and first DLL delay control signals PSEL<2> and PSEL<1>, respectively, instead of the third DLL delay control signal PSEL<3>.

For example, when that only the third DLL delay control signal PSEL<3> is enabled to a high level, the first unit delay circuit 1133 of the first delay setting unit 1132 delays the DLL clock DCLK by the delay interval of the second and third NAND gates ND2, ND3 and outputs the first pre delay DLL clock PREVCLK1. The second unit delay circuit 1134 delays the first pre delay DLL clock PREVCLK1 via the NAND gates ND1 and ND3, and outputs the second pre delay DLL clock PREVCLK2. Similarly, the third unit delay circuit 1135 delays the second pre delay DLL clock PREVCLK2 via the NAND gates ND1 and ND3, and outputs the delay DLL signal VCLK. Accordingly, the delay DLL signal VCLK is delayed by 6 NAND gate delay intervals with respect to the DLL clock DCLK.

When only the second DLL delay control signal PSEL<2> is enabled to a high level, the output PREVCLK1 of the first unit delay circuit 1133 is a low signal. The second unit delay circuit 1134 generates the output PREVCLK2 by delaying the input signal DLL clock DCLK via the NAND gates ND2 and ND3. The third unit delay circuit 1135 then generates the output VCLK by delaying the input signal PREVCLK2 via the NAND gates ND1 and ND3. Accordingly, the delay DLL signal VCLK is delayed by 4 NAND gate delay intervals with respect to the DLL clock DCLK.

When only the first DLL delay control signal PSEL<1> is enabled to a high level, the output PREVCLK1 of the first unit delay circuit 1133 and the output PREVCLK2 of the second unit delay circuit 1134 are low signals. The third unit delay circuit 1135 delays the input signal DLL clock DCLK via the NAND gates ND2 and ND3 and outputs the delay DLL clock VCLK. Accordingly, the delay DLL signal VCLK is delayed by 2 NAND gate delay intervals with respect to the DLL clock DCLK.

In summary, by enabling the third DLL delay control signal PSEL<3>, the first delay setting unit 1132 delays the DLL clock DCLK by the longest delay interval and outputs it as the delay DLL clock VCLK. By enabling the first DLL delay control signal PSEL<1>, the first delay setting unit 1132 delays the DLL clock DCLK by the shortest delay interval and output it as the delay DLL clock VCLK. By enabling the second DLL delay control signal PSEL<2>, the first delay setting unit 1132 delays the DLL clock DCLK by an in-between delay interval and outputs it as the delay DLL clock VCLK.

In an embodiment of the invention described above, only one of the first, second, or third DLL delay setting signals PSEL<1:3> is asserted at any one time. However, the invention need not be so limited. Other implementations of the first delay setting unit 1132 may be used such that there may be n DLL delay setting signals PSEL<1:n>, and where more than one of the n DLL delay setting signals PSEL<1:n> may be asserted at any given time. Additionally, there may be different number of unit delay circuits in the first delay setting unit 1132 than the three units described.

Referring back to FIG. 5, the phase comparison unit 114 is configured to compare the phase of the internal clock ICLK and the phase of the phase comparison DLL clock BCLK and output a plurality of comparison signals COMP for adjusting the delay interval of the delay line 112. The phase division unit 115 is configured to generate a first DLL clock RDCLK and a second DLL clock FDCLK that are substantially 180 degrees out of phase with each other. The phase division unit 115 includes a first transfer gate T1 and a first inverter IN1. The first transfer gate T1 is configured to transfer the DLL clock DCLK and generate the first DLL clock RDCLK, and the first inverter IN1 is configured to invert the DLL clock DCLK and generate the second DLL clock FDCLK.

Referring to FIGS. 4-7, the DLL circuit 11 configured as above generates the first and second DLL clocks RDCLK, FDCLK by delaying the clock ECLK by the set delay interval. The DLL circuit 11 advances the transition timings of the first and second DLL clocks RDCLK, FDCLK by decreasing the set delay interval according to the first to third DLL delay setting signals PSEL<1:3>. In general, the DLL circuit 11 is provided in order to synchronize the transition timing of the clock ECLK with the output timing of the data. When the phase of the clock ECLK is equal to the phase of the DLL clock DCLK, the output circuit outputs the data in synchronization with the DLL clock DCLK.

Figure 8:
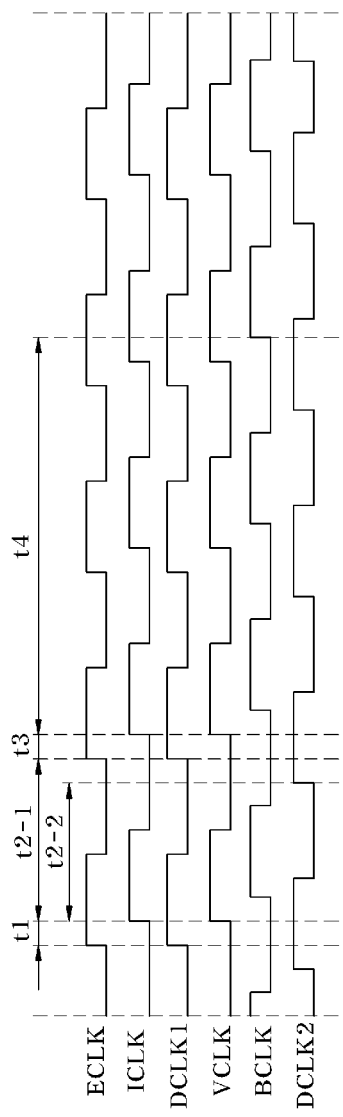
FIG. 8 is a timing diagram showing the operation of the DLL circuit illustrated in FIG. 5.

More specifically, as illustrated in FIG. 8, the clock buffer unit 111 buffers the clock ECLK and generates the internal clock ICLK. Due to the internal delay of the clock buffer unit 111, the clock ECLK is delayed by a first delay interval t1 and then outputted as the internal clock ICLK. The delay line 112 delays the internal clock ICLK by a second interval t2-1 and outputs an initial DLL clock DCLK1. Then, the second DLL delay setting signal PSEL<2> is enabled and the delay interval of the first delay setting unit 1132 is adjusted. Accordingly, the first delay setting unit 1132 delays the initial DLL clock DCLK1 by a third delay interval t3 and outputs the delay DLL clock VCLK. The delay model unit 1131 delays the delay DLL clock VCLK by a fourth delay interval t4 and outputs the phase comparison DLL clock BCLK.

The phase comparison unit 114 compares the phase of the internal clock ICLK with the phase of the phase comparison DLL clock BCLK and generates the plurality of comparison signals COMP. In FIG. 8, the transition timing of the phase comparison DLL clock BCLK leads the transition timing of the internal clock ICLK, so the phase comparison unit 114 down-counts the plurality of comparison signals COMP. The delay line 112 delays the internal clock ICLK by a fifth delay interval t2-2 according to the plurality of down-counted comparison signals COMP and outputs the second DLL clock DCLK2. Since the fifth delay interval t2-2 is shorter than the second delay interval t2-1, the transition timing of the DLL clock DCLK leads the transition timing of the initial DLL clock DCLK1. In other words, the transition timing of the DLL clock DCLK leads the transition timing of the clock ECLK. The phase division unit 115 generates the first and second DLL clocks RDCLK, FDCLK from the DLL clock DCLK.

Figure 9:
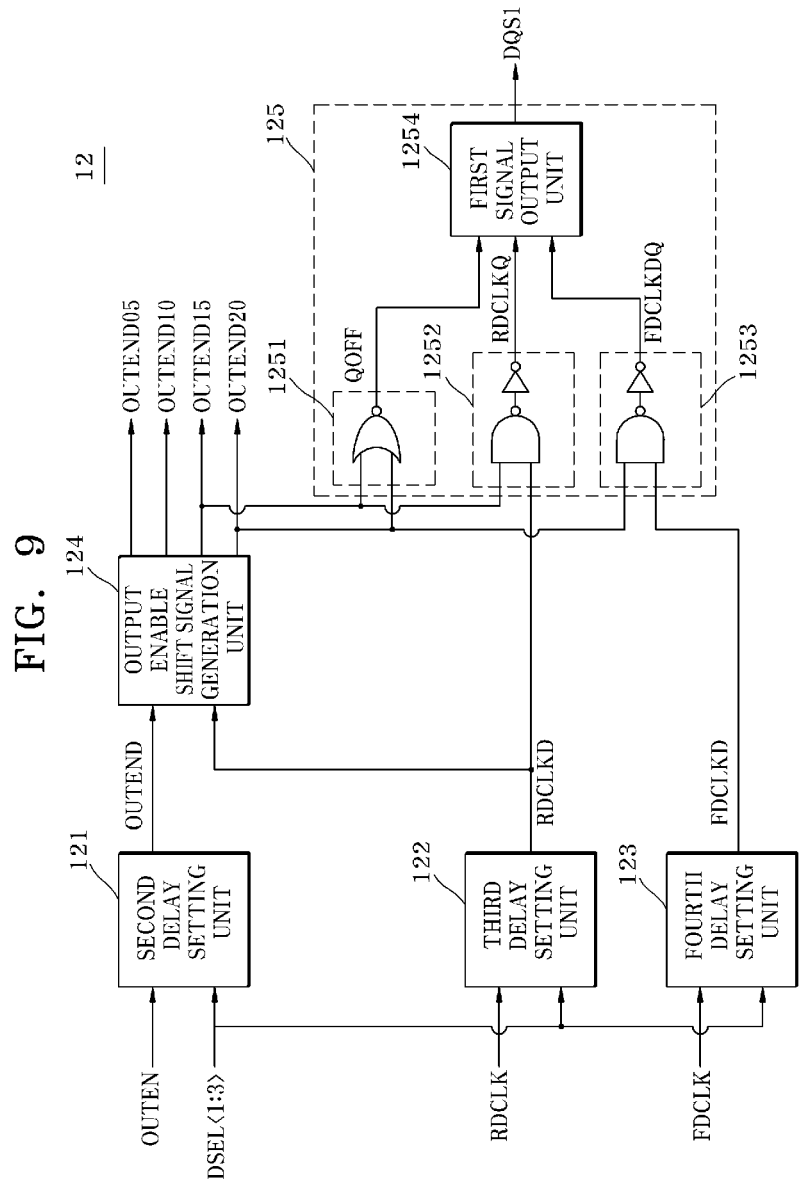
FIG. 9 is a block diagram of a first data strobe signal generation unit illustrated in FIG. 3.

As illustrated in FIG. 9, the first data strobe signal generation unit 12 includes second to fourth delay setting units 121, 122, 123, an output enable shift signal generation unit 124, and a first data strobe signal output unit 125.

The second delay setting unit 121 shown in FIG. 9 may be similar to the first delay setting unit 1132 described with respect to FIG. 6. That is, the second delay setting unit 121 may include fourth, fifth, and sixth unit delay circuits although not shown in FIG. 9. The fourth unit delay circuit is configured to output a first pre delay output enable signal from an output enable signal OUTEN and a pull-down voltage VSS according to a third data transmission control signal DSEL<3>. The fifth unit delay circuit is configured to output a second pre delay output enable signal from the output enable signal OUTEN and the first pre delay output enable signal according to a second data transmission control signal DSEL<2>. The sixth unit delay circuit is configured to output a delay output enable signal OUTEND from the output enable signal OUTEN and the second pre delay output enable signal according to a first data transmission control signal DSEL<1>.

For example, when only the third data transmission control signal DSEL<3> is enabled to a high level, the fourth unit delay circuit of the second delay setting unit 121 delays the output enable signal OUTEN and outputs the first pre delay output enable signal, and the fifth and sixth unit delay circuits delay the first pre delay output enable signal and output the delay output enable signal OUTEND. For another example, when only the first data transmission control signal DSEL<1> is enabled to a high level, the sixth unit delay circuit delays the output enable signal OUTEN and outputs the delay output enable signal OUTEND.

Therefore, the second delay setting unit 121 outputs the delay output enable signal OUTEND by delaying the output enable signal OUTEN according to the first to third data transmission control signals DSEL<1:3>. When the third data transmission control signal DSEL<3> is enabled, the fourth delay setting unit 121 outputs the delay output enable signal OUTEND by delaying the output enable signal OUTEN by the longest delay interval. When the first data transmission control signal DSEL<1> is enabled, the fourth delay setting unit 121 outputs the delay output enable signal OUTEND by delaying the output enable signal OUTEN by the shortest delay interval.

The third delay setting unit 122 may be similar to the first delay setting unit 1132 described and shown in FIG. 6. The third delay setting unit 122 may include seventh, eighth, and ninth unit delay circuits (not shown in FIG. 9). The seventh unit delay circuit is configured to output a first pre data output synchronization signal from the first DLL clock RDCLK and the pull-down voltage VSS according to the third data transmission control signal DSEL<3>. The eighth unit delay circuit is configured to output a second pre data output synchronization signal from the first DLL clock RDCLK and the first pre data output synchronization signal according to the second data transmission control signal DSEL<2>. The ninth unit delay circuit is configured to output a first data output synchronization signal RDCLKD from the first DLL clock RDCLK and the second pre data output synchronization signal according to the first data transmission control signal DSEL<1>. Since the operation of the third delay setting unit 122 is substantially similar to that of the second delay setting unit 121, the detailed description thereof will be omitted.

The fourth delay setting unit 123 may also be similar to the first delay setting unit 1132 described and shown in FIG. 6. The fourth delay setting unit 123 may includes tenth, eleventh, and twelfth unit delay circuits (not shown in FIG. 9). The tenth unit delay circuit is configured to output a third pre data output synchronization signal from the second DLL clock FDCLK and the pull-down voltage VSS according to the third data transmission control signal DSEL<3>. The eleventh unit delay circuit is configured to output a fourth pre data output synchronization signal from the second DLL clock FDCLK and the third pre data output synchronization signal according to the second data transmission control signal DSEL<2>. The twelfth unit delay circuit is configured to output a second data output synchronization signal FDCLKD from the second DLL clock FDCLK and the fourth pre data output synchronization signal according to the first data transmission control signal DSEL<1>. Since the operation of the fourth delay setting unit 123 is substantially similar to that of the second delay setting unit 121, the detailed description thereof will be omitted.

Figure 10:
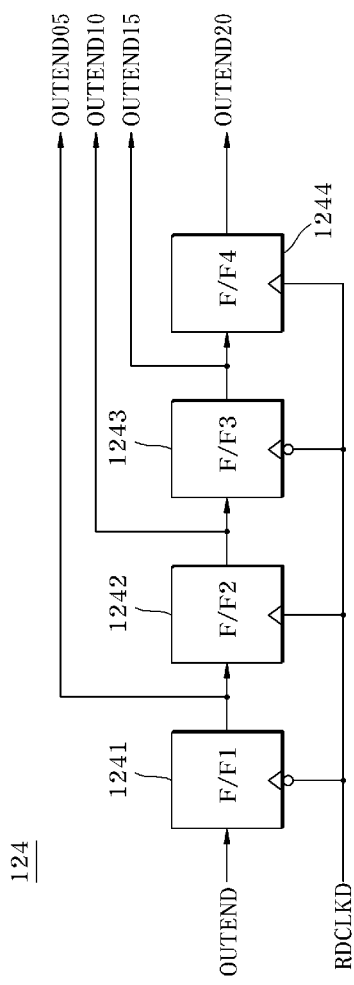
FIG. 10 is a circuit diagram of an output enable shift signal generation unit illustrated in FIG. 9.

As illustrated in FIG. 10, the output enable shift signal generation unit 124 includes first to fourth shifters 1241, 1242, 1243, 1244. The first shifter 1241 is configured to output a first output enable shift signal OUTEND05 by synchronizing the delay output enable signal OUTEND with the first data output synchronization signal RDCLKD. The second shifter 1242 is configured to output a second output enable shift signal OUTEND10 by synchronizing the first output enable shift signal OUTEND05 with the first data output synchronization signal RDCLKD. The third shifter 1243 is configured to output a third output enable shift signal OUTEND15 by synchronizing the second output enable shift signal OUTEND10 with the first data output synchronization signal RDCLKD. The fourth shifter 1244 is configured to output a fourth output enable shift signal OUTEND20 by synchronizing the third output enable shift signal OUTEND15 with the first data output synchronization signal RDCLKD. The output enable shift signal generation unit 124 generates the first to fourth output enable shift signals OUTEND05, OUTEND10, OUTEND15, OUTEND20, which are sequentially enabled, by synchronizing the delay output enable signal OUTEND with the first data output synchronization signal RDCLKD.

The first data strobe signal output unit 125 shown in FIG. 9 includes a first high impedance determination signal generation unit 1251, a first rising control signal generation unit 1252, a first falling control signal generation unit 1253, and a first signal output unit 1254. The first high impedance determination signal generation unit 1251 is configured to perform a NOR operation on the third and fourth output enable shift signals OUTEND15, OUTEND20 and output a first high impedance determination signal QOFF.

The first rising control signal generation unit 1252 is configured to perform an AND operation on the third output enable shift signal OUTEND15 and the first data output synchronization signal RDCLKD, and output a first rising control signal RDCLKDQ. The first falling control signal generation unit 1253 is configured to perform an AND operation on the fourth output enable shift signal OUTEND20 and the second data output synchronization signal FDCLKD, and output a first falling control signal FDCLKDQ. The first signal output unit 1254 is configured to output a first data strobe signal DQS1 in response to the first high impedance determination signal QOFF, the first rising control signal RDCLKDQ, and the first falling control signal FDCLKDQ.

The first high impedance determination signal QOFF is enabled in response to an enable timing of the third output enable shift signal OUTEND15 and disabled in response to the fourth output enable shift signal OUTEND20. The first rising control signal RDCLKDQ is the first data output synchronization signal RDCLKD, which changes within the enable period of the third output enable shift signal OUTEND15, and the first falling control signal FDCLKDQ is the second data output synchronization signal FDCLKD, which changes within the enable period of the fourth output enable shift signal OUTEND20.

The first data strobe signal generation unit 12 (see FIGS. 4 and 9-10) configured as above generates the first data strobe signal DQS1, which is derived from the first and second DLL clocks RDCLK, FDCLK and the output enable signal OUTEN and whose enable timing is delayed in response to the data transmission control signals DSEL<1:3>.

Figure 11:
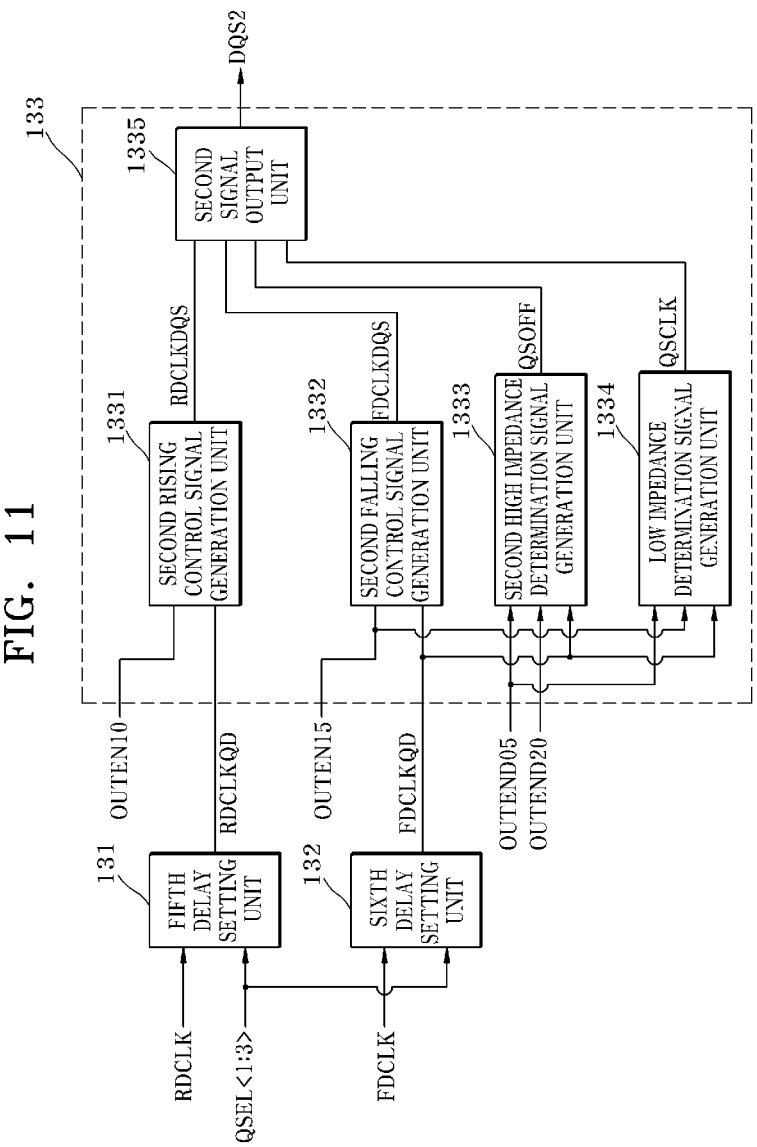
FIG. 11 is a block diagram of a second data strobe signal generation unit illustrated in FIG. 3.

As illustrated in FIG. 11, the second data strobe signal generation unit 13 includes fifth and sixth delay setting units 131, 132 and a second data strobe signal output unit 133.

The fifth delay setting unit 131 may be similar to the first delay setting unit 1132 described and shown in FIG. 6. The fifth delay setting unit 131 may includes thirteenth, fourteenth, and fifteenth unit delay circuits. The thirteenth unit delay circuit is configured to output a first pre data input synchronization signal from the first DLL clock RDCLK and the pull-down voltage VSS according to a third data reception control signal QSEL<3>. The fourteenth unit delay circuit is configured to output a second pre data input synchronization signal from the first DLL clock RDCLK and the first pre data input synchronization signal according to a second data reception control signal QSEL<2>. The fifteenth unit delay circuit is configured to output a first data input synchronization signal RDCLKQD from the first DLL clock RDCLK and the second pre data input synchronization signal according to a first data reception control signal QSEL<1>. Since the operation of the fifth delay setting unit 131 is substantially similar to that of the second delay setting unit 121, the detailed description thereof will be omitted.

The sixth delay setting unit 132 may be similar to the first delay setting unit 1132 described and shown in FIG. 6. The sixth delay setting unit 132 may include sixteenth, seventeenth, and eighteenth unit delay circuits. The sixteenth unit delay circuit is configured to output a third pre data input synchronization signal from the second DLL clock FDCLK and the pull-down voltage VSS according to the third data reception control signal QSEL<3>. The seventeenth unit delay circuit is configured to output a fourth pre data input synchronization signal from the second DLL clock FDCLK and the third pre data input synchronization signal according to the second data reception control signal QSEL<2>. The eighteenth unit delay circuit is configured to output a second data input synchronization signal FDCLKQD from the second DLL clock FDCLK and the fourth pre data input synchronization signal according to the first data reception control signal QSEL<1>. Since the operation of the sixth delay setting unit 132 is substantially similar to that of the second delay setting unit 121, detailed description thereof will be omitted.

The second data strobe signal output unit 133 shown in FIG. 11 includes a second rising control signal generation unit 1331, a second falling control signal generation unit 1332, a second high impedance determination signal generation unit 1333, a low impedance determination signal generation unit 1334, and a second signal output unit 1335.

Figure 12:
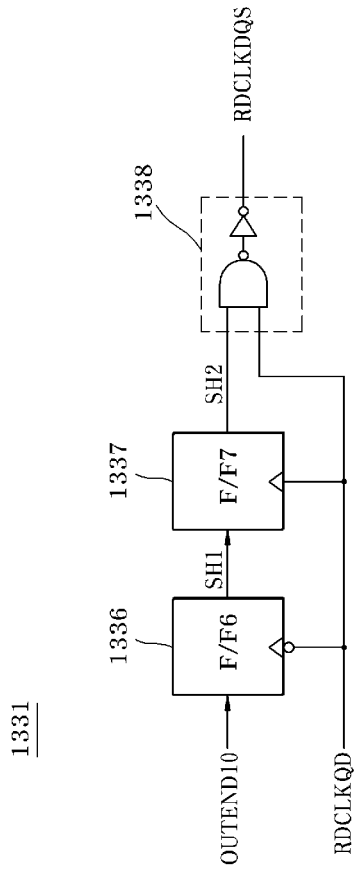
FIG. 12 is a circuit diagram of a second rising control signal generation unit illustrated in FIG. 11.

As illustrated in FIG. 12, the second rising control signal generation unit 1331 includes fifth and sixth shifters 1336, 1337 and a first AND gate 1338. The fifth shifter 1336 is configured to output a first shift signal SH1 by shifting the second output enable shift signal OUTEND10 according to an inversion signal of the first data input synchronization signal RDCLKQD. The sixth shifter 1337 is configured to output a second shift signal SH2 by shifting the first shift signal SH1 according to the first data input synchronization signal RDCLKQD. The first AND gate 1338 is configured to output a second rising control signal RDCLKDQS by performing an AND operation on the first data input synchronization signal RDCLKQD and the second shift signal SH2. The second rising control signal generation unit 1331 configured as above outputs the first data input synchronization signal RDCLKQD, which changes in the enable period of the second shift signal SH2, as the second rising control signal RDCLKDQS, wherein the second shift signal SH2 is generated by sequentially shifting the second output enable shift signal OUTEND10 according to the first data input synchronization signal RDCLKQD.

Figure 13:
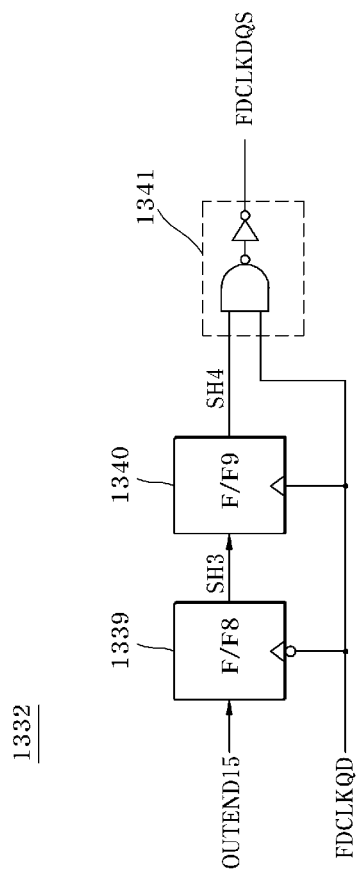
FIG. 13 is a circuit diagram of a second falling control signal generation unit illustrated in FIG. 11.

As illustrated in FIG. 13, the second falling control signal generation unit 1332 includes seventh and eighth shifters 1339, 1340 and a second AND gate 1341. The seventh shifter 1339 is configured to output a third shift signal SH3 by shifting the third output enable shift signal OUTEND15 according to an inversion signal of the second data input synchronization signal FDCLKQD. The eighth shifter 1340 is configured to output a fourth shift signal SH4 by shifting the third shift signal SH3 according to the second data input synchronization signal FDCLKQD. The second AND gate 1341 is configured to output a second falling control signal FDCLKDQS by performing an AND operation on the second data input synchronization signal FDCLKQD and the fourth shift signal SH4. The second falling control signal generation unit 1332 configured as above outputs the second data input synchronization signal FDCLKQD, which changes in the enable period of the fourth shift signal SH4, as the second falling control signal FDCLKDQS, wherein the fourth shift signal SH4 is generated by sequentially shifting the third output enable shift signal OUTEND15 according to the second data input synchronization signal FDCLKQD.

Figure 14:
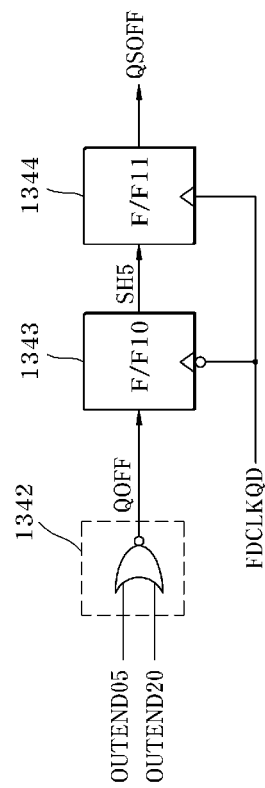
FIG. 14 is a circuit diagram of a second high impedance determination signal generation unit illustrated in FIG. 11.

As illustrated in FIG. 14, the second high impedance determination signal generation unit 1333 includes a first NOR gate 1342 and ninth and tenth shifters 1343, 1344. The first NOR gate 1342 is configured to output a pre high impedance determination signal QOFF by performing a NOR operation on the first and second output enable shift signals OUTEND05 and OUTEND20. The ninth shifter 1343 is configured to output a fifth shift signal SH5 by shifting the pre high impedance determination signal QOFF according to the inversion signal of the second data input synchronization signal FDCLKQD. The tenth shifter 1344 is configured to output a second high impedance determination signal QSOFF by shifting the fifth shift signal SH5 according to the second data input synchronization signal FDCLKQD. The second high impedance determination signal generation unit 1333 outputs the second high impedance determination signal QSOFF by synchronizing the pre high impedance determination signal QOFF with the second data input synchronization signal FDCLKQD, wherein the pre high impedance determination signal QOFF is enabled from the enable timing of the first output enable shift signal OUTEND05 to the disable timing of the fourth output enable shift signal OUTEND20.

Figure 15:
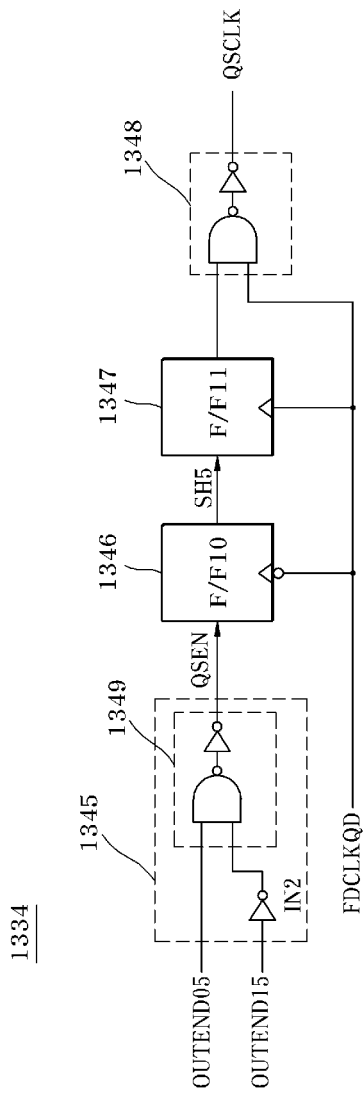
FIG. 15 is a circuit diagram of a low impedance determination signal generation unit illustrated in FIG. 11.

As illustrated in FIG. 15, the low impedance determination signal generation unit 1334 includes a pre low impedance determination signal generation unit 1345, eleventh and twelfth shifters 1346, 1347, and a third AND gate 1348. The pre low impedance determination signal generation unit 1345 is configured to output a pre low impedance determination signal QSEN in response to the first and third output enable shift signals OUTEND05 and OUTEND15. The eleventh shifter 1346 is configured to output a sixth shift signal SH6 by shifting the pre low impedance determination signal QSEN according to the inversion signal of the second data input synchronization signal FDCLKQD. The twelfth shifter 1347 is configured to output a seventh shift signal SH7 by shifting the sixth shift signal SH6 according to the second data input synchronization signal FDCLKQD. The third AND gate 1348 is configured to output a low impedance determination signal QSCLK by performing an AND operation on the second data input synchronization signal FDCLKQD and the seventh shift signal SH7. The pre low impedance determination signal generation unit 1345 includes a second inverter IN2 and a fourth AND gate 1349. The second inverter IN2 is configured to invert the third output enable shift signal OUTEND15. The fourth AND gate 1349 is configured to output the pre low impedance determination signal QSEN by performing an AND operation on the first output enable shift signal OUTEND05 the output of the second inverter IN2.

The second data strobe signal generation unit 13 configured as above generates the second data strobe signal DQS2, which is derived from the first to fourth output enable shift signals OUTEND05 to OUTEND20 generated by shifting the first and second DLL clocks RDCLK and FDCLK and the output enable signal, and whose enable timing is delayed in response to the data reception control signals QSEL<1:3>.

The operation of the DDR DRAM 3 in the system having the above-described configuration will be described below with reference to FIG. 16. The DDR DRAM 3 operates as a data transmitting device, and the memory controller 4 operates as a data receiving device. It is assumed that the transfer path of the data DQ is longer than the transfer path of the second data strobe signal DQS2.

First, when a read command READ is inputted at time t0 of the clock ECLK, the DLL circuit 11 delays the clock ECLK by a set delay interval and generates the DLL clock DCLK. As shown in FIG. 16, the DLL delay setting signals PSEL<1:3> are inputted to the DLL circuit 11 in a disabled state, that is, a low level. Therefore, the DLL circuit 11 adjusts the transition timing of the DLL clock DCLK until the phase of the DLL clock DCLK becomes equal to the phase of the clock ECLK. When the phase of the clock ECLK become equal to the phase of the DLL clock DCLK, the DLL circuit 11 divides the phase of the DLL clock DCLK and outputs the first and second DLL clocks RDCLK and FDCLK.

The first data strobe signal generation unit 12 delays the output enable signal OUTEN and the first and second DLL clocks RDCLK and FDCLK according to the data transmission control signals DSEL<1:3>, and outputs the delayed output enable signal OUTEND and the first and second data output synchronization signals RDCLKD, FDCLKD. The data transmission control signals DSEL<1:3> are inputted to the first data strobe signal generation unit 12 in a disabled state, that is, a low level. Accordingly, the first data strobe signal generation unit 12 outputs the delayed output enable signal OUTEND and the first and second data output synchronization signals RDCLKD, FDCLKD, without delaying the output enable signal OUTEN and the first and second DLL clocks RDCLK, FDCLK. Consequently, the first data strobe signal generation unit 12 generates the first data strobe signal DQS1 which changes from time t4 of the clock ECLK in synchronization with the first and second data output synchronization signals RDCLKD, FDCLKD.

The data output unit 2 outputs the data DQ1, DQ2, DQ3, DQ4 in synchronization with the first data strobe signal DQS1 at the time t4 of the clock ECLK.

The second data strobe signal generation unit 13 delays the first and second DLL clocks RDCLK, FDCLK according to the data reception control signals QSEL<1:3>, and outputs the first and second data input synchronization signals RDCLKQD, FDCLKQD. At this time, only the first data reception control signal QSEL<1> is inputted to the second data strobe signal generation unit 13 in an enabled state, that is, a high level. Therefore, the second data strobe signal generation unit 13 delays the first and second DLL clocks RDCLK, FDCLK by an internal tD, and outputs the first and second data input synchronization signals RDCLKQD, FDCLKQD. The interval tD is a delay interval of the fifteenth and eighteenth unit delay circuits which are provided inside the fifth and sixth delay setting units 131, 132 to set the delay interval in response to the first data reception control signal QSEL<1>. Consequently, the second data strobe signal generation unit 13 generates the second data strobe signal DQS2 which changes from the interval t4+tD of the clock ECLK in response to the first and second data input synchronization signals RDCLKQD, FDCLKQD.

When the semiconductor device outputs the data DQ1, DQ2, DQ3, DQ4 at the time t4 of the clock ECLK and outputs the second data strobe signal DQS2 at the time t4+tD of the clock ECLK, the output timing of the data DQ1, DQ2, DQ3, DQ4 is earlier than the output timing of the second data strobe signal DQS2. Hence, the memory controller can stably receive the data DQ1, DQ2, DQ3, DQ4.

Figure 16:
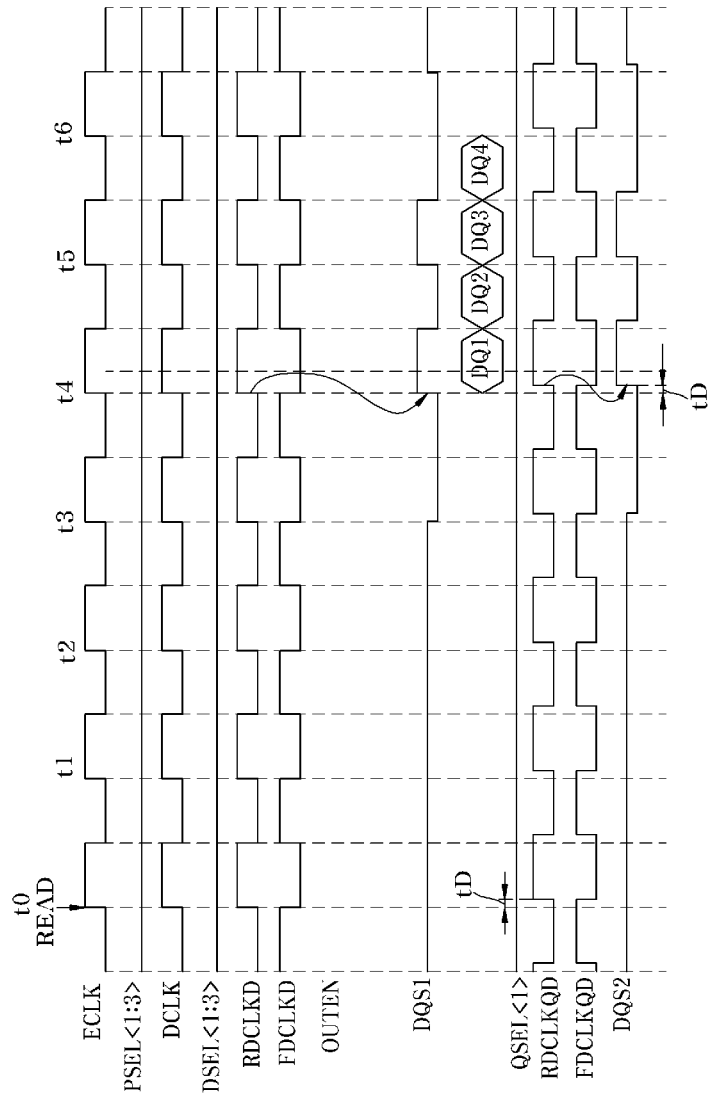
FIGS. 16 to 18 are timing diagrams showing the operation of the system illustrated in FIG. 3.
Figure 17:
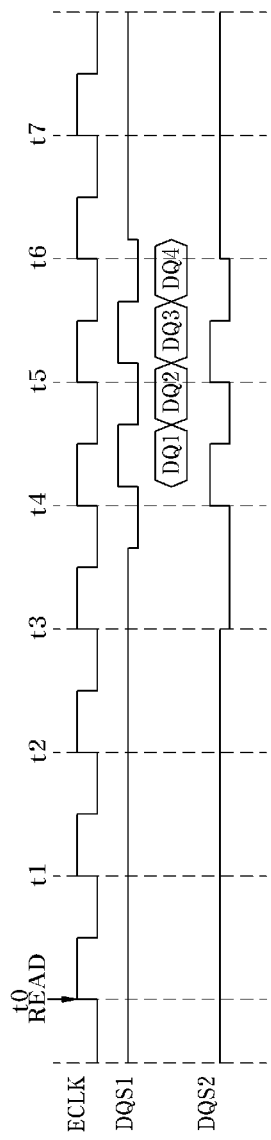
Figure 18:
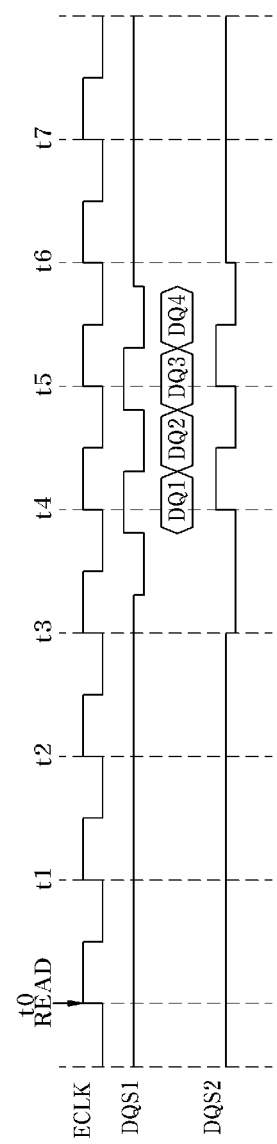

Referring to FIG. 16, by delaying the output timing of the data DQ1, DQ2, DQ3, DQ4, the memory controller can stably receive the data DQ1, DQ2, DQ3, DQ4 in synchronization with the second data strobe signal DQS2 as illustrated in FIG. 17. Also, by advancing the output timing of the data DQ1, DQ2, DQ3, DQ4, the memory controller can stably receive the data DQ1, DQ2, DQ3, DQ4 in synchronization with the second data strobe signal DQS2 as illustrated in FIG. 18.

As described above, the semiconductor device according to an embodiment of the present invention controls the output timing of the data and the output timing of the data strobe signal in order to substantially prevent the data transmission error caused by the difference in the transfer paths of the data and the data strobe signal. For example, when the transfer path of the data strobe signal is longer than the transfer path of the data, the arrival timing of the data strobe signal is later than the arrival timing of the data. In this case, the semiconductor device according to an embodiment of the present invention enables the memory controller to stably receive data in synchronization with the data strobe signal by advancing the output timing of the data strobe signal as compared to the output timing of the data. Consequently, the data can be stably transmitted/received between the semiconductor device and the memory controller.

Although various embodiments of the invention have been described using memory devices, the invention need not be so limited. Various embodiments of the invention may be used in circuitry wherever different signals need to be synchronized.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor device comprising:
  a first data strobe signal generation unit receiving clock signals, an output enable signal, and data transmission control signals, and configured to generate a first data strobe signal based at least on the clock signals and the output enable signal, wherein enable timing of the first data strobe signal is delayed in response to at least a portion of the data transmission control signals; and
  a second data strobe signal generation unit receiving clock signals and a plurality of output enable shift signals, and configured to generate a second data strobe signal in response to the clock and the plurality of output enable shift signals generated by shifting the output enable signal.

2. The semiconductor device of claim 1, wherein the enable timing of the first data strobe signal is later than the enable timing of the second data strobe signal.

3. The semiconductor device of claim 1, wherein the clock signals comprise:
  a first clock and a second clock generated from a common clock, wherein the first clock and the second clock are substantially 180 degrees out of phase with each other.

4. The semiconductor device of claim 3, wherein the first data strobe signal generation unit comprises:
  a second delay setting unit configured to output a delay output enable signal by delaying the output enable signal according to first, second, and third data transmission control signals;
  a third delay setting unit configured to output a first data output synchronization signal by delaying the first clock according to the first, second, and third data transmission control signals;
  a fourth delay setting unit configured to output a second data output synchronization signal by delaying the second clock according to the first, second, and third data transmission control signals;
  an output enable signal shift signal generation unit configured to generate first, second, third, and fourth output enable shift signals among the plurality of output enable shift signals by sequentially shifting the delay output enable signal according to the first data output synchronization signal; and
  a first data strobe signal output unit configured to output the first data strobe signal in response to the third and fourth output enable shift signals and the first and second data output synchronization signals.

5. The semiconductor device of claim 4, wherein the second delay setting unit comprises:
  a first unit delay circuit configured to generate a first pre delay output enable signal from the output enable signal and a pull-down voltage according to the third data transmission control signal;
  a second unit delay circuit configured to generate a second pre delay output enable signal from the output enable signal and the first pre delay output enable signal according to the second data transmission control signal; and
  a third unit delay circuit configured to generate the delay output enable signal from the output enable signal and the second pre delay output enable signal according to the first data transmission control signal.

6. The semiconductor device of claim 4, wherein the third delay setting unit comprises:
  a fourth unit delay circuit configured to output a first pre data output synchronization signal from the first clock and a pull-down voltage according to the third data transmission control signal;
  a fifth unit delay circuit configured to output a second pre data output synchronization signal from the first clock and the first pre data output synchronization signal according to the second data transmission control signal; and
  a sixth unit delay circuit configured to output the first data output synchronization signal from the first clock and the second pre data output synchronization signal according to the first data transmission control signal.

7. The semiconductor device of claim 4, wherein the fourth delay setting unit comprises:

a seventh unit delay circuit configured to output a third pre data output synchronization signal from the second clock and a pull-down voltage according to the third data transmission control signal;

an eighth unit delay circuit configured to output a fourth pre data output synchronization signal in response to the second data transmission control signal, the second clock, and the third pre data output synchronization signal; and a ninth unit delay circuit configured to output the second data output synchronization signal in response to the first data transmission control signal, the second clock, and the fourth pre data output synchronization signal.

8. The semiconductor device of claim 4, wherein the output enable shift signal generation unit comprises:

a first shifter configured to output the first output enable shift signal by synchronizing the delay output enable signal with the first data output synchronization signal;

a second shifter configured to output the second output enable shift signal by synchronizing the first output enable signal with the first data output synchronization signal;

a third shifter configured to output the third output enable shift signal by synchronizing the second output enable shift signal with the first data output synchronization signal; and a fourth shifter configured to output the fourth output enable shift signal by synchronizing the third output enable shift signal with the first data output synchronization signal.

9. The semiconductor device of claim 4, wherein the first data strobe signal output unit comprises:

a first high impedance determination signal generation unit configured to perform a NOR operation on the third and fourth output enable shift signals, and output a first high impedance determination signal;

a first rising control signal generation unit configured to perform an AND operation on the third output enable shift signal and the first data output synchronization signal, and output a first rising control signal;

a first falling control signal generation unit configured to perform an AND operation on the fourth output enable shift signal and the second data output synchronization signal, and output a first falling control signal; and a first signal output unit configured to output the first data strobe signal in response to the first high impedance determination signal, the first rising control signal, and the first falling control signal.

10. A semiconductor device comprising:

a first data strobe signal generation unit receiving clock signals and an output enable signal, and configured to generate a first data strobe signal in response to the clock signals and the output enable signal; and a second data strobe signal generation unit configured to generate a second data strobe signal which based on the clock signals and a plurality of output enable shift signals generated by shifting the output enable signal, wherein the enable timing of the second data strobe signal is delayed in response to data reception control signals.

11. The semiconductor device of claim 10, wherein the enable timing of the second data strobe signal is later than the enable timing of the first data strobe signal.

12. The semiconductor device of claim 10, wherein the clock signals comprise:

a first clock and a second clock generated from a common clock, wherein the first and second clocks are substantially 180 degrees out of phase with each other.

13. The semiconductor device of claim 12, wherein the second data strobe signal generation unit comprises:

a first delay setting unit configured to output a first data input synchronization signal by delaying the first clock according to first, second, and third data reception control signals among the data reception control signals;

a second delay setting unit configured to output a second data input synchronization signal by delaying the second clock according to the first, second, and third data reception control signals; and a second data strobe signal output unit configured to output the second data strobe signal in response to the first and second data input synchronization signals and the first, second, third, and fourth output enable shift signals among the plurality of output enable shift signals.

14. The semiconductor device of claim 13, wherein the first delay setting unit comprises:

a first unit delay circuit configured to generate a first pre data input synchronization signal from the first clock and a pull-down voltage according to the third data reception control signal;

a second unit delay circuit configured to generate a second pre data input synchronization signal from the first clock and the first pre data input synchronization signal according to the second data reception control signal; and a third unit delay circuit configured to generate the first data input synchronization signal from the first clock and the second pre data input synchronization signal according to the first data reception control signal.

15. The semiconductor device of claim 13, wherein the second delay setting unit comprises:

a fourth unit delay circuit configured to generate a third pre data input synchronization signal from the second clock and a pull-down voltage according to the third data reception control signal;

a fifth unit delay circuit configured to generate a fourth pre data input synchronization signal from the second clock and the third pre data input synchronization signal according to the second data reception control signal; and a sixth unit delay circuit configured to generate the second data input synchronization signal from the second clock and the second pre data input synchronization signal according to the first data reception control signal.

16. The semiconductor device of claim 13, wherein the second data strobe signal output unit comprises:

a second rising control signal generation unit configured to output the first data input synchronization signal as a second rising control signal in response to the second output enable shift signal;

a second falling control signal generation unit configured to output the second data input synchronization signal as a second falling control signal in response to the third output enable shift signal;

a second high impedance determination signal generation unit configured to generate a second high impedance determination signal in response to the first and fourth output enable shift signals and the second data input synchronization signal;

a low impedance determination signal generation unit configured to generate a low impedance determination signal in response to the first and third output enable shift signals and the second data input synchronization signal; and a second signal output unit configured to generate the second data strobe signal in response to the second rising control signal, the second falling control signal, the second high impedance determination signal, and the low impedance determination signal.

17. A semiconductor device comprising:
a delay locked loop (DLL) circuit configured to generate a DLL clock by delaying a clock by a set delay interval determined by DLL delay setting signals;
a first data strobe signal generation unit configured to generate a first data strobe signal which is derived from the DLL clock and an output enable signal, and whose enable timing is delayed in response to data transmission control signals; and
a second data strobe signal generation unit configured to generate a second data strobe signal which is derived from the DLL clock and a plurality of output enable shift signals generated by shifting the output enable signal, and whose enable timing is delayed in response to data reception control signals.

18. The semiconductor device of claim 17, wherein the DLL circuit comprises:
a clock buffer unit configured to buffer the clock and output the buffered clock as an internal clock;
a delay line configured to output the DLL clock by delaying the internal clock according to a plurality of comparison signals;
a first delay unit configured to output a phase comparison DLL clock by delaying the DLL clock in response to the DLL delay setting signals; and
a phase comparison unit configured to compare a phase of the internal clock with a phase of the phase comparison DLL clock, and output the plurality of comparison signals.

19. The semiconductor device of claim 18, wherein the first delay unit comprises:
a first delay setting unit configured to output a delay DLL clock by delaying the DLL clock according to first, second, and third DLL delay setting signals; and
a delay model unit configured to output the phase comparison DLL clock by delaying the delay DLL clock by a fixed delay interval.

20. The semiconductor device of claim 19, wherein the delay interval of the delay line is decreased when the first delay setting unit outputs the delay DLL clock by delaying the DLL clock.

21. The semiconductor device of claim 19, wherein the first delay setting unit comprises:
a first unit delay circuit configured to generate a first pre delay DLL clock from the DLL clock and a pull-down voltage according to the third DLL delay control signal;
a second unit delay circuit configured to generate a second pre delay DLL clock from the DLL clock and the first pre delay DLL clock according to the second DLL delay control signal; and
a third unit delay circuit configured to generate the delay DLL clock from the DLL clock and the second pre delay DLL clock according to the first DLL delay control signal.

22. The semiconductor device of claim 18, wherein the DLL circuit further comprises a phase division unit configured to generate first and second DLL clocks from the DLL clock, wherein the first and second DLL clocks are substantially 180 degrees out of phase with each other.

23. The semiconductor device of claim 22, wherein the first data strobe signal generation unit comprises:
a second delay setting unit configured to output a delay output enable signal by delaying the output enable signal according to first to third data transmission control signals among the data transmission control signals;
a third delay setting unit configured to output a first data output synchronization signal by delaying the first DLL clock according to the first to third data transmission control signals;
a fourth delay setting unit configured to output a second data output synchronization signal by delaying the second DLL clock according to the first to third data transmission control signals;
an output enable signal shift signal generation unit configured to generate first to fourth output enable shift signals among the plurality of output enable shift signals by sequentially shifting the delay output enable signal according to the first data output synchronization signal; and
a first data strobe signal output unit configured to output the first data strobe signal in response to the third and fourth output enable shift signals and the first and second data output synchronization signals.

24. A system comprising:
a data transmitting device comprising a data strobe signal generation unit configured to generate first and second data strobe signals in response to an output enable signal, and a data output unit configured to transmit data in synchronization with the first data strobe signal; and
a data receiving device configured to receive the data in synchronization with the second data strobe signal.

25. The system of claim 24, wherein the transition timing of the first data strobe signal is equal to or different from the transition timing of the second data strobe signal.

26. The system of claim 24, wherein the second data strobe signal and the data are transferred with an equal or different loading.

* * * * *